US007164735B2

(12) United States Patent
Gierl et al.

(10) Patent No.: US 7,164,735 B2
(45) Date of Patent: Jan. 16, 2007

(54) PHASE-LOCKED LOOP FOR SYNCHRONIZATION WITH A SUBCARRIER CONTAINED IN AN INTELLIGENCE SIGNAL

(75) Inventors: Stefan Gierl, Karlsruhe (DE); Christoph Benz, Ohlsbach (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 642 days.

(21) Appl. No.: 10/096,341

(22) Filed: Mar. 11, 2002

(65) Prior Publication Data

US 2002/0146086 A1    Oct. 10, 2002

(30) Foreign Application Priority Data

Mar. 9, 2001    (DE) ................. 101 11 402

(51) Int. Cl.
   *H04D 3/24*    (2006.01)
   *H03L 7/06*    (2006.01)
(52) U.S. Cl. .................. 375/327; 375/376; 327/147
(58) Field of Classification Search ........... 375/316, 375/322, 324, 327, 354, 371, 373–376; 327/100, 327/141, 147, 156; 324/76.77
   See application file for complete search history.

(56) References Cited

U.S. PATENT DOCUMENTS 4,675,614 A * 6/1987 Gehrke ..................... 327/3
4,694,327 A    9/1987 Demmer et al. ........... 358/19
4,703,340 A    10/1987 Balaban et al. ............ 358/19
4,797,635 A * 1/1989 Hatcher ..................... 331/17
5,222,252 A * 6/1993 Kasser .................... 455/67.13
5,355,393 A    10/1994 Nyenhuis et al. ........... 375/97
5,892,692 A * 4/1999 Whikehart et al. ......... 708/272

FOREIGN PATENT DOCUMENTS

| DE | 19716909 | 4/1998 |
| DE | 19738914 | 3/1999 |
| EP | 0512606 | 11/1992 |
| EP | 0594403 | 4/1994 |
| GB | 2135844 | 9/1984 |

* cited by examiner

*Primary Examiner*—Kevin Burd
(74) *Attorney, Agent, or Firm*—O'Shea, Getz & Kosakowski, P.C.

(57) ABSTRACT

A phase-locked loop locks relatively quickly to a pilot tone of the stereo-multiplex signal when a new transmitter is tuned in. The stereo-multiplex signal may be multiplied in a multiplier by the quadrature component of the pilot tone generated by a digital oscillator. The result is a control signal that is provided to a low-pass filter, and the low-pass filtered control signal is provided as a control signal to an oscillator which may include a table of length N and a counter for addressing the table entries. The zero phase angle $\phi_0$ may be set by a counter offset $n_0$ by incrementing or decrementing the counter. A table may be utilized having a virtual length N+ which is larger than the length N of the real table. To access the real table, however, the corresponding MSBs of the actual count n(k) are used which match the address space of the real table of length N.

28 Claims, 1 Drawing Sheet

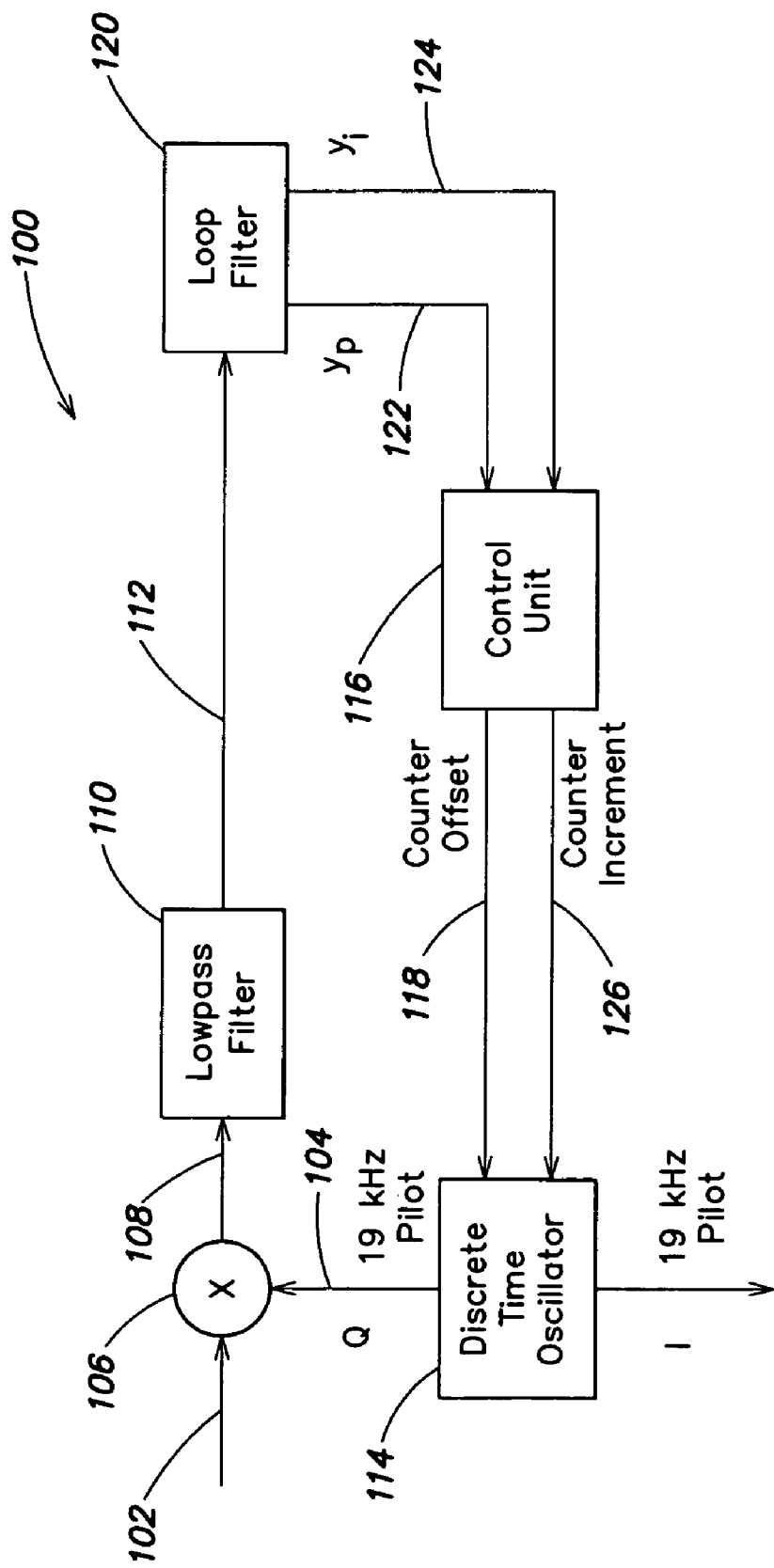

PHASE-LOCKED LOOP FOR SYNCHRONIZATION WITH A SUBCARRIER CONTAINED IN AN INTELLIGENCE SIGNAL

BACKGROUND OF THE INVENTION

The present invention relates to the field of signal synchronization, and in particular to a phase-locked loop for achieving synchronization with a subcarrier contained in an intelligence signal.

DESCRIPTION OF THE RELEVANT ART

VHF radio transmitters such as FM radio stations broadcast a stereo-multiplex signal that includes a number of components. These components include (i) an audio center signal (also referred to as a mono signal) of up to 15 kHz; (ii) a stereo pilot tone at 19 kHz; (iii) a stereo signal in the 23 kHz to 53 kHz band; (iv) a Motorist Radio Information signal; (v) a narrow-band amplitude-modulated signal at 57 kHz; and (vi) a Radio Data System (RDS) signal.

To demodulate the stereo-multiplex signal, synchronization with the 19 kHz pilot tone is required which serves as an auxiliary carrier. It is desirable for this synchronization to occur as quickly as possible each time a new transmitter is tuned.

SUMMARY OF THE INVENTION

According to one aspect of the invention, a method for synchronizing with a subcarrier contained in an intelligence signal comprises multiplying the intelligence signal by a quadrature component of a subcarrier to generate a first control signal, low-pass filtering the first control signal, and generating the quadrature component of the subcarrier in response to the low-pass filtered first control signal.

In accordance with another aspect of the invention, a phase-locked loop for synchronization with a subcarrier contained in an intelligence signal comprises a digital oscillator having an output at which a quadrature component of the subcarrier is generated in response to a control signal. A multiplier includes a first input that receives the intelligence signal and a second input that receives the oscillator output, and generates the control signal. The control signal is the product of the intelligence signal and the quadrature component. A low-pass filter filters the multiplier output to provide a filtered control signal.

In a further aspect of the invention, a phase-locked loop for synchronization with a subcarrier contained in an intelligence signal multiplies the intelligence signal by a quadrature component of a subcarrier to generate a control signal, which is filtered and the resultant filtered signal is used to generate the quadrature component of the subcarrier in response to the low-pass filtered control signal.

These and other objects, features and advantages of the present invention will become more apparent in light of the following detailed description of preferred embodiments thereof, as illustrated in the accompanying drawings.

BRIEF DESCRIPTION OF THE DRAWING

The FIGURE is a block diagram of a phase-lock loop circuit for synchronizing with a subcarrier contained in an intelligence signal.

DETAILED DESCRIPTION OF THE INVENTION

The present invention is directed to achieving rapid and precise synchronization with a subcarrier contained in an intelligence signal. Specifically and in accordance with one embodiment, the present invention is directed to synchronizing with an auxiliary carrier of a stereo-multiplex signal. In one particular application, the present invention is directed to a phase-locked loop circuit and method for synchronizing with a 19 kHz pilot tone component of a VHF stereo-multiplex signal. The present invention enables a tuner to demodulate the stereo-multiplex signal by quickly synchronizing with the pilot tone component, which serves as an auxiliary carrier for the stereo-multiplex signal. As will be described in detail below with reference to one particular embodiment, a product of the intelligence signal and a quadrature component of the subcarrier is low-pass filtered and used to control an oscillator to generate the subcarrier quadrature component.

The FIGURE is a schematic block diagram of one embodiment of a phase-locked loop circuit 100 for synchronizing with a subcarrier contained in an intelligence signal. In the exemplary application, the intelligence signal is a stereo-multiplex signal 102. The phase-locked loop circuit 100 receives the stereo-multiplex signal 102. The stereo-multiplex signal 102 is presented at the first input of a multiplier 106 whose output 108 is connected with the input of a low-pass filter 110. As will be described in detail below, an oscillator 114 generates a quadrature component 104 of the subcarrier of the stereo-multiplex signal 102. In this exemplary application, the quadrature component 104 is the 19 kHz pilot tone component of the stereo-multiplex signal 102 and the quadrature component 104 is applied to a second input of the multiplier 106. The stereo-multiplex signal 102 is multiplied by the quadrature component 104 (i.e., a 19 kHz pilot tone) at the multiplier 106 to generate a first control signal 108. As will be described in detail below, the first control signal 108 is used to control the oscillator 114 to generate the quadrature component 104.

The first control signal 108 is provided to the low-pass filter 110 which filters the first control signal 108 and provides a filtered first control signal 112 to control the oscillator 114 to generate the quadrature component 104 as described below. The output of the low pass filter 110 is connected to the input of a loop filter 120, which generates second and third control signals 122, 124, which are described below. The control signals 122, 124 are provided to an oscillator control circuit 116. In one embodiment, the oscillator 114 is a digital oscillator and the oscillator control circuit 116 is an arithmetic unit. The oscillator control circuit 116 generates two control signals 126, 118 which are used to control the digital oscillator 114 as described below.

In one embodiment, the digital oscillator 114 comprises a look-up table (LUT) of length N and a counter that is configured and arranged to address the table entries which are preferably integers of n bits each. The control signal 126 generated by the oscillator control circuit 116 is a table address increment value, while the control signal 118 is a counter offset value. The table increment value 126 is used to determine which entries in the oscillator table are read while the counter offset 118 is provided to the digital oscillator 114 to increment or decrement the counter to set the zero phase angle $\phi_0$. In one embodiment, a table entry LUT(n), located at address n, is determined according to equation 1:

$$LUT(n)=NINT(2^{(nbit-1)}\cdot\sin(2\pi n/N)), \quad (1)$$

where:
n is an integer between 0 and N−1;
N is the length of the table;
nbit is the word length of a table entry; and
NINT signifies rounding to the next higher integer.

As noted, in accordance with one embodiment of the present invention, the quadrature component 104 is the 19 kHz pilot component. The digital oscillator 114, therefore, preferably generates a sinusoidal quadrature component 104 having a frequency $f_0$ of 19 kHz. To generate the sinusoidal signal 104 having a frequency of 19 kHz given a scanning frequency $f_A$ of 176.4 kHz, the oscillator table entries are read with an increment Δn 126 that is calculated by the oscillator control circuit 116 in accordance with equation 2.

$$\Delta n = NINT(N\cdot(f_0/f_A)) \quad (2)$$

Given a table of length N=256, for example, the resulting increment Δn is 110.

As noted, the control signal 118 is a counter offset value that is provided to the digital oscillator 114 to increment or decrement the counter to set the zero phase angle $\phi_0$. To set the zero phase angle ($\phi_0$) in the counter, the counter offset 118 is calculated in one embodiment of the digital control circuit 116 according to equation 3:

$$n_0 = NINT((\phi_0/2\pi)\cdot N) \quad (3)$$

where $n_0$ is the counter offset value.

In another embodiment of the invention, the counter offset 118 is a time-variable offset $n_0(k)$. In this embodiment, the count n(k) at time $k*T_A$, where $T_A=1/f_A$, is calculated by equation 4:

$$n(k)=(n(k-1)+\Delta n+n_0(k)) \text{ modulo } N \quad (4)$$

To minimize any accumulation of rounding errors when calculating the addresses of the table entries, another embodiment provides for a virtual table having a length that is significantly larger than the length N in the actual table. For example, in one embodiment, the length of the virtual table is 64 times as large as the table length N. All calculations of counts and addresses are computed based on the above equations for the virtual table. To access the real table, however, only the corresponding most significant bits of the actual count n(k) are used which match the address space of the real table of length N.

As noted, the first control signal 108 is filtered by the low-pass filter 110. In response to the low-pass-filtered signal 112, the loop filter 120 generates the control signals 122, 124. The second control signal $y_p$ 122 is proportional to the first control signal 108. The loop filter 120 also generates the third control signal $y_i$ 124 which is averaged over time from the first control signal 108. As noted, the control signals 122, 124 are provided to the oscillator control circuit 116. In this illustrative embodiment, the oscillator control circuit 116 is an arithmetic unit that calculates the offset $n_0(k)$ for the counter of the digital oscillator 114 from the second control signal $y_p$ 122 and the third control signal $y_i$ 124 according to the equation 5:

$$n_0(k)=NINT(c_p\cdot y_p\cdot(N/2\pi)+c_i\cdot y_i\cdot(N/2\pi)) \quad (5)$$

In equation 5, the constants $c_p$ and $c_i$ regulate the control response of the phase-locked loop 100. Based on an appropriate selection of the constants $c_p$ and $c_i$, the phase-locked loop 100 may be controlled in a manner analogous to that of a program identification (PI) controller. Since control of the phase of the pilot tone 104 generated by the oscillator 114 is performed via the time-variable offset $n_0(k)$, a similarly time-variable increment is produced for access to the table of the counter.

To reduce memory space in the oscillator table, in one embodiment of the invention a quarter period of a sinusoidal signal is stored. It should be appreciated, however, that with this approach the resulting calculations of the addresses are more elaborate.

Synchronization of the pilot tone contained in the stereo-multiplex signal 102 with the pilot tone 104 generated by the digital oscillator 114 is achieved as soon as the first control signal 108 becomes zero. This is the case when the quadrature component 104 of the pilot tone generated by the oscillator 114 stands in quadrature to the pilot tone contained in the stereo-multiplex signal 102.

The method according to the invention and the phase-locked loop according to the invention are distinguished by the advantage of fast synchronization. This means that the phase-locked loop according to the invention locks in quickly. Another advantage of the method according to the invention is that the method may be implemented through software.

As noted, the present invention can be utilized to achieve rapid and precise synchronization with a subcarrier contained in an intelligence signal. In the exemplary application described above, the present invention is directed to synchronizing with an auxiliary carrier of a VHF stereo-multiplex signal. As one of ordinary skill in the art would appreciate, the synchronization approach of the present invention can be implemented in conjunction with any tuner now or later developed to enable the tuner to demodulate an intelligence signal such as the noted stereo-multiplex signal. The present invention is particularly well-suited for stereo radio receivers, specifically car radios.

Although the present invention has been shown and described with respect to several preferred embodiments thereof, various changes, omissions and additions to the form and detail thereof, may be made therein, without departing from the spirit and scope of the invention.

What is claimed is:

1. A method for synchronizing with a subcarrier contained in an intelligence signal, comprising the steps of:
    multiplying the intelligence signal by a quadrature component of a subcarrier to generate a first control signal;
    low-pass filtering the first control signal;
    generating second and third control signals in parallel to each another, where the second control signal is proportional to the filtered first control signal and the third control signal is averaged over time from the filtered first control signal; and
    generating the quadrature component of the subcarrier in response to the second and third control signals.

2. The method of claim 1, where an oscillator is utilized to generate the quadrature component of the subcarrier, where the oscillator comprises:
    a table of length N; and
    a counter which serves to access the table entries, the counter having a count beginning at a specified offset and incrementing at a specified increment.

3. The method of claim 2, where the table entries comprise integers of n bits each.

4. The method of claim 2, where the step of generating the quadrature component of the subcarrier comprises the step of:

reading the table entries at an increment specified in accordance with the filtered first control signal.

5. The method of claim 2, where the step of generating the quadrature component of the subcarrier comprises the step of:
setting the offset of the counter to cause a phase angle in the oscillator to be set to zero.

6. The method of claim 4, where the step of generating the quadrature component of the subcarrier further comprises the step of:
adjusting the counter by an offset $n_0$ to set a zero phase angle $\phi_0$ in the oscillator prior to reading the table entries.

7. The method of claim 2, where the method further comprises the step of:
forming entries LUT(n) each located at an address n of the table in accordance with the equation LUT(n)=NINT $(2^{(nbit-1)} \cdot \sin(2\pi n/N))$, where n is an integer between 0 and N−1; N is the length of the table; nbit is the word length of a table entry; and the operator NINT signifies rounding to the next higher integer.

8. The method of claim 4, where the subcarrier quadrature component comprises a sinusoidal signal of frequency $f_0$ at a scanning frequency of $f_A$, and where the step of reading the table entries at a increment specified in accordance with the filtered first control signal comprises the step of:
determining the specified increment according to the equation $\Delta n=NINT(N \cdot f_0/f_A)$, where operator NINT signifies rounding to the next higher integer.

9. The method of claim 5, where the step of setting the offset of the counter to cause a phase angle in the oscillator to be set to zero comprises the step of:
calculating the offset $n_0$ of the counter from the zero phase angle $\phi_0$ according to the equation $n_0=NINT((\phi_0/2\pi) \cdot N)$.

10. The method of claim 5, further comprising the step of:
calculating a count of the counter at time $k*T_A$, where $T_A=1/f_A$ and $f_A$ is the scanning frequency, according to the equation $n(k)=(n(k-1)+\Delta n+n_0(k))$ modulo N.

11. The method of claim 2, where the table comprises a length N and where the step of generating the quadrature component of the subcarrier comprises the step of:
determining a virtual count offset and increment into a virtual table of length N+ which is larger than the length N of the table, where the corresponding most significant bits of the actual count n(k) are used to access to the table which match the address space of the table of length N.

12. The method of claim 2, further comprising the step of calculating the offset $n_0(k)$ of the counter from the second and third control signals according to the equation $n_0(k)=NINT(c_p \cdot y_p-(N\sim/2\pi)+c_i \cdot y_i \cdot (N\sim/2\pi))$, where $c_p$ and $c_i$ are constants for regulating the control response.

13. The method of claim 1, where a quarter period of a sinusoidal signal is stored.

14. The method of claim 1, where the method is implemented as software.

15. The method of claim 1, where the intelligence signal comprises a stereo-multiplex signal, and where the subcarrier comprises a pilot tone at a frequency of 19 kHz.

16. A phase-locked loop for synchronization with a subcarrier contained in an intelligence signal, comprising:
an oscillator having an output at which a quadrature component of the subcarrier is generated;
a multiplier having a first input at which the intelligence signal is received and a second input connected to the output of the oscillator, and an output at which a first control signal is generated, the first control signal being the product of the intelligence signal and the quadrature component;
a low-pass filter having an input connected to the multiplier output and an output at which a low-pass filtered first control signal is generated;
a loop filter that is responsive to the low-pass filtered first control signal, and generates second and third control signals in parallel, where the second control signal is proportional to the low-pass filtered first control signal, and the third control signal is averaged over time from the low-pass filtered first control signal; and
an oscillator control circuit that is responsive to the second and third control signals, and provides a pair of additional control signals to the oscillator to control the generation of the quadrature component of the subcarrier.

17. The phase-locked loop of claim 16, where the oscillator control circuit comprises an arithmetic unit having first and second inputs at which the second and third control signals are received, the arithmetic unit having first and second outputs connected to the oscillator.

18. The phase-locked loop of claim 16, where the oscillator comprises:
a table of length N; and
a counter which serves to address the table entries.

19. The phase-locked loop of claim 18, where the table entries comprise integers of n bits each.

20. The phase-locked loop of claim 18, where the table entries are readable with a specified counter increment value.

21. The phase-locked loop of claim 18, where a zero phase angle in the oscillator is set by changing the counter by an offset value.

22. The phase-locked loop of claim 18, where table entries LUT(n) each located at an address n of the table in accordance with the equation LUT(n)=NINT($2^{(nbit-1)} \cdot \sin(2\pi n/N)$), where n is an integer between 0 and N−1; N is the length of the table; nbit is the word length of a table entry; and the operator NINT signifies rounding to the next higher integer.

23. The phase-locked loop of claim 18, where the subcarrier quadrature component comprises a sinusoidal signal of frequency $f_0$ at a scanning frequency of $f_A$, and where the increment at which the table entries are read is determined according to the equation $\Delta n=NINT(N \cdot (f_0/f_A))$, where operator NINT signifies rounding to the next higher integer.

24. The phase-locked loop of claim 18, where an offset $n_0$ of the counter is calculated from a zero phase angle $\phi_0$ according to the equation $n_0=NINT((\phi_0/2\pi) \cdot N)$.

25. The phase-locked loop of claim 18, where a counter increment is calculated at time $k*T_A$, where $T_A=1/f_A$ and $f_A$ is the scanning frequency, according to the equation $n(k)=(n(k-1)+\Delta n+n_0(k))$ modulo N.

26. The phase-locked loop of claim 18, where the oscillator control circuit calculates an offset $n_0(k)$ of the counter from the second and third control signals according to the equation $n_0(k)=NINT(c_p \cdot y_p-(N\sim/2\pi)+c_i y_i \cdot (N\sim/2\pi))$, where $c_p$ and $c_i$ are constants for regulating the control response.

27. The phase-locked loop of claim 16, where the intelligence signal comprises a stereo-multiplex signal, and the subcarrier comprises a pilot tone at a frequency of 19 kHz.

28. A phase-locked loop for synchronization with a subcarrier contained in an intelligence signal, comprising:
an oscillator that generates and provides a quadrature component of the subcarrier;

a multiplier that multiples the intelligence signal and the quadrature component, and provides a first control signal indicative thereof;

a low-pass filter that filters the first control signal and provides a filtered signal indicative thereof;

a loop filter that receives the filtered signal and generates second and third control signals in parallel, where the second control signal is proportional to the filtered signal, and the third control signal is averaged over time from the filtered signal; and an oscillator control circuit that is responsive to the second and third control signals, and provides a pair of additional control signals to the oscillator to control the generation of the quadrature component.

* * * * *